United States Patent
Schwarz et al.

(10) Patent No.: US 6,700,477 B2
(45) Date of Patent: Mar. 2, 2004

(54) SIGNAL-TRANSMISSION DEVICE

(75) Inventors: Gerhard Schwarz, Schoenbrunn-Allemuchl (DE); Udo Becker, Muehlheim (DE); Rainer Hillebrand, Bochum (DE)

(73) Assignee: Ceag Sicherheitstechnik GmbH, Soest (DE)

( * ) Notice: Subject to any disclaimer, the term of this patent is extended or adjusted under 35 U.S.C. 154(b) by 406 days.

(21) Appl. No.: 09/861,894

(22) Filed: May 22, 2001

(65) Prior Publication Data

US 2002/0021558 A1 Feb. 21, 2002

(30) Foreign Application Priority Data

May 22, 2000 (DE) ..................................... 200 09 207 U

(51) Int. Cl.$^7$ ................................................. G08B 5/00
(52) U.S. Cl. ............... 340/286.01; 340/679; 340/686.1; 340/686.2; 340/687
(58) Field of Search ................................ 439/76.1, 189, 439/928, 716, 638, 67, 717; 700/122; 312/194; 340/286.01, 679, 686.1, 687, 686.2

(56) References Cited

U.S. PATENT DOCUMENTS

| 5,471,603 A | * | 11/1995 | Yokote .......................... 711/2 |
| 5,764,935 A | * | 6/1998 | Bechtolsheim et al. ..... 710/110 |
| 6,210,179 B1 | * | 4/2001 | Lausberg .................... 439/76.1 |
| 6,241,561 B1 | * | 6/2001 | Zebermann .................. 439/716 |
| 6,249,448 B1 | * | 6/2001 | Regnier ...................... 363/144 |

FOREIGN PATENT DOCUMENTS

DE          WO 96/31815         10/1996     ........... G05B/19/05

* cited by examiner

*Primary Examiner*—Daryl Pope
(74) *Attorney, Agent, or Firm*—Fish & Richardson P.C.

(57) ABSTRACT

A device for transmitting signals between an automation system and field device comprises a supporting plate and modules which are attachable to said supporting plate. The modules are provided with terminals especially for field devices. The supporting plate has arranged thereon data lines of a local bus and voltage-supply lines. The modules have at least local bus interfaces. The device additionally comprises at least one bus coupling module which is attachable to the supporting plate and which is provided with a local bus interface and a field bus interface for communication with said modules and said automation system.

20 Claims, 1 Drawing Sheet

SIGNAL-TRANSMISSION DEVICE

Figure 1:
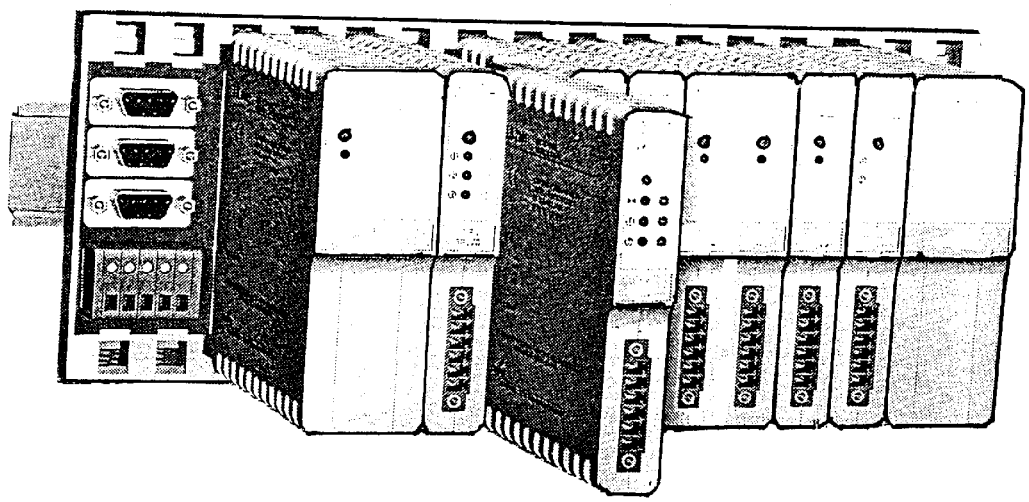

The present invention relates to a device for transmitting signals between an automation system and field devices, comprising a supporting plate and modules which are attachable to said supporting plate and which are provided with terminals especially for field devices, the supporting plate having arranged thereon data lines of a local bus and voltage-supply lines, and said modules having at least local bus interfaces, and further comprising at least one bus coupling modules which is attachable to the supporting plate and which is provided with a local bus interface and a field bus interface for communication with said modules and said automation system.

Such a device is known from WO 96/31815. The known device is used for intrinsically safe signal matching so as to permit an, in the sense of explosion protection, safe separation of the signal flow between an automation system and so-called field devices, i.e. sensors and actors, in an explosion-prone process.

The field devices are connected via modules which are adapted to be attached to a supporting plate. The supporting plate has normally arranged thereon at least three data lines in the form of a local bus as well as voltage supply lines to which the modules, when attached, are connected via respective interfaces. In order to establish the connection to the automation system, the supporting plate has also attached thereto a bus coupling module. This bus coupling module comprises a local bus interface as well as a field bus interface. Communication with the modules takes place via the local bus interface and communication with the automation system takes place via the field bus interface.

In the case of the known device, all the modules have the same width, normally 16 mm, so that they can be attached to standardized plug-in places of the supporting plate at an arbitrary location. Depending on the nature of the modules, each of the modules provides either one, two or three channels at the most. The modules are adapted to have attached thereto respective field devices, such as sensors, actors or the like.

It is the object of the present invention to improve the signal-transmission device of the type mentioned at the start in such a way that said signal-transmission device permits more variation possibilities with respect to the mode of arrangement of the modules on the supporting plate while simultaneously reducing the costs per channel.

In connection with the features of the generic clause of claim 1, this object is achieved in that modules having a single plug-in place width and/or modules having at least a double plug-in place width are attachable to respective plug-in places of the supporting plate and that they are identifiable by the bus coupling module and/or the automation system.

Due to the use of modules having different plug-in place widths, it is possible to vary the structural design of the signal-transmission device and to use modules having different plug-in place widths depending on the requirements to be satisfied. In this connection it is not necessary to externally input the arrangement of the individual modules via hardware or software. Instead, the modules and the arrangement of the modules are identified via the local bus by means of the bus coupling module or also directly via the automation system.

In the case of the device according to the present invention, it is possible to use either only modules having a single plug-in place width or only modules having a double plug-in place width and to identify them accordingly, or to attach both kinds of modules to a supporting plate and to identify them accordingly.

A modification with respect to e.g. the modules having a double plug-in place width does not take place on the supporting plate, since the modules can be attached to the existing plug-in places. Hence, also supporting plates which are already installed on a wall or on a switch cabinet can be upgraded for use with modules having a double plug-in place width. This can be done by using a bus coupling module which has been adapted via hardware or by suitably programming the existing bus coupling module from the automation system.

The supporting plate is implemented, as usual, as a so-called backplane, cf. also the above-mentioned prior art.

At least the modules having a double plug-in place width may be multi-channel modules so as to provide more channels simultaneously in connection with the modules having a larger plug-in place width. These multi-channel modules may e.g. provide eight channels per module. This will substantially increase the number of channels per module and, consequently, also per supporting plate, whereby the costs per channel can be reduced still further.

The modules having a single plug-in place width may especially be used when channels having a higher priority have to be provided.

Since modules having a single plug-in place width and modules having a larger plug-in place width are standardized with respect to the plug-in places and since an identification can be carried out independently of the position of the respective modules on the supporting plates, modules of different plug-in place widths can be combined in an arbitrary manner.

Identification of a module can be carried out e.g. by interrogating the various plug-in places with respect to their occupation and by interrogating subsequently via the plug-in places the respective module attached. In doing so, it can be determined whether e.g. two juxtaposed plug-in places are occupied by only one module, whereupon this module can be identified as a module having a double plug-in width.

In order to simplify the identification of the different modules, the modules may be provided with encoders.

The encoders can be adapted to be programmed or adjusted by the bus coupling module and/or by the automation system so that the respective modules can easily be encoded even after having been attached to the supporting plate. In this way, an address or an identification can externally be associated with each module via the local bus, said address or identification being stored in the module and being recallable at any time.

It is also possible to program and/or to adjust the modules by means of software with respect to an identification code already prior to attaching them to the supporting plate; this programming and/or adjusting can be done via a computer, the automation system or the like. It is also possible to encode the modules from outside and by hand with the aid of suitable operating means (hardware).

The bus coupling module may be provided with a configuration and/or parameter storage means so that an initialization or control of the various modules on the associated supporting plate can be carried out directly from the bus coupling module. Data can be inputted in said configuration and/or parameter storage means via a suitable interface means or from the automation system directly. At this point, reference should be made to the fact that such an automation system may, for example, be a memory-programmable control or a guiding system.

In connection with the storage means in the bus coupling module, it is additionally considered to be advantageous when the storage means is non-volatile so that the respective configuration and parameter data will not get lost in the case of a failure of the voltage supply.

At least one power unit module can be attachable to the supporting plate so that also the voltage supply for the respective supporting plate can be arranged in a simple manner. It is, of course, also possible to attach more than one power unit module per supporting plate, if e.g. a replacement power unit module or the like is provided. This applies analogously to the bus coupling module, which can have associated therewith a further bus coupling module for reasons of redundancy or for providing e.g. two bus connections to the automation system.

The supporting plate may be composed of supporting plate modules so that it can be assembled in accordance with the requirements to be satisfied. These supporting plate modules can be releasably interconnected; in so doing, the respective connections to the local bus and the voltage supply lines are established simultaneously.

At least one supporting plate module can be implemented as an interface module and/or as an auxiliary power supply module so as to provide, in addition to the external access, a further voltage supply and respective interfaces for the signal-transmission device. The interface module is provided with the respective interfaces for the normally used bus systems or the like. The interface module and/or the auxiliary power supply module are preferably attached to the ends of the supporting plate.

The module may be provided with at least one display means so that a state of a module or also other parameters of the module can be represented optically. Such a display means may comprise e.g. one or a plurality of LEDs in different colours.

The module may be an I/O signal matching module so as to convert the signals between field devices and the automation system in a suitable manner.

In order to be able to use the signal-transmission device according to the present invention in explosion-prone areas, at least the modules having a single plug-in place width may be implemented as an explosion-proof and/or intrinsically safe electrical equipment.

The module may be provided with a screwed plug connection means on the front surface thereof so that the field device can easily be connected to said module. Such a connection means may also be implemented as a spring force-contact plug, as a plug having a cap or as a similar kind of connection means.

Figure 2:
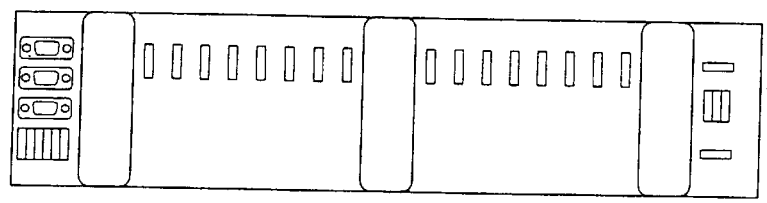

In the following, an advantageous embodiment of the present invention will be explained in detail making reference to the figures enclosed in the drawings, in which:

FIG. 1 shows a perspective front view of a signal-transmission device according to the present invention having modules attached to a supporting plate, and FIG. 2 shows a front view of a supporting plate according to FIG. 1 in the case of which part of the modules have been removed.

FIG. 1 shows, in a perspective front view, an embodiment of a signal-transmission device 1. The device includes a supporting plate 2, i.e. a so-called backplane. This supporting plate 2 is releasably secured to a mounting rail 25 which is used for mounting the device on a wall or for mounting it in a switch cabinet which is not shown. The mounting rail 25 is standardized.

The supporting plate 2 has provided thereon a large number of plug-in places 14, cf. FIG. 2, to which the modules 3–9 can be attached as I/O signal matching modules. In addition, a bus coupling module 11 and a power unit module 16 are attached to the supporting plate 2. Depending on their width, the signal matching modules 3–9 occupy one or a plurality of plug-in places 14. Modules 3, 4, 5, 6, 8 and 9, for example, each require one plug-in place; hence, they are implemented such that their width corresponds to the width 12 of one plug-in place, whereas module 7 occupies two plug-in places 14 and is implemented such that its width corresponds to the width 13 of two plug-in places.

Modules of different plug-in place widths can be combined in an arbitrary manner.

Each signal matching module 3–9 is provided with an encoder 15, which is realized as software or as hardware and which is adapted to be interrogated by the bus coupling module 11. The interrogation takes place via a local bus which is arranged on the supporting plate 2 and which is adapted to be accessed by all modules via the respective plug-in places 14. Also the voltage supply of the various modules takes place via the plug-in places 14 which are connected to voltage supply lines arranged on the supporting plate 2. The respective voltage is fed via the power unit module 16.

The front of the signal matching modules 3–9 is provided with connections 10 in the form of screwed plug connection means 22 which are adapted to have attached thereto complementary screwed plug connectors connected to field devices which are not shown. The connectors and, accordingly, the connecting means may be mechanically encoded so as to exclude incorrectly installed connectors or confusions.

The signal matching module 7 having a double plug-in place width 13 is implemented as a multi-channel module. It may, for example, comprise eight channels so as to be associated with eight different field devices or other means. The other signal matching modules 3, 4, 5, 6, 8, 9 are normally implemented such that they comprise only one channel or two channels and they are used for providing channels having a higher priority and in particular explosion-proof and intrinsically safe terminals.

The various modules have display means 21 on their front surfaces. These display means are defined e.g. by LEDs of different colours.

Also the supporting plate 2 is implemented after the fashion of a module and comprise a plurality of supporting plate modules 17, 18, cf. FIG. 2, and, at its ends, an interface module 19 and an auxiliary power supply module 20. For interconnecting the various modules e.g. the bus coupling module 11 and the power unit module 16, respectively, may be used, cf. again FIG. 2.

The interface module 19 has a plurality of connections 23 to which various bus systems can be connected. Furthermore, it may be provided with auxiliary power terminals 24, which are provided on the auxiliary power supply module 20 as well.

According to the present invention, it is possible to use a signal-transmission device comprising modules of different plug-in place widths in an arbitrary arrangement on the supporting plate, in the case of which the various modules are identifiable and associable with the respective plug-in places on the supporting plate. The modules can operate in an analogous or digital fashion and the modules having a larger width comprise at least eight channels. In this way, it is possible to increase the number of channels per supporting plate and to reduce the costs per channel. No restrictions exist with regard to the arrangement of the various modules on the supporting plate, and the modules can be combined on said supporting plate in an arbitrary manner. The modules serve as I/O signal matching modules for e.g. valves, initiators, optical coupling devices, measuring transducers, thermocouplers or the like. The modules are fastened to the supporting plate by snap-mounting them at the respective plug-in places.

It will be advantageous to program the device according to the present invention from the automation system via a suitable bus connection to the bus coupling module or via the bus connections 23 on the interface module, i.e. from outside and independently of the automation system.

What is claimed is:

1. A means for transmitting signals between an automation system and field devices, comprising a supporting plate and modules which are attachable to said supporting plate and which are provided with terminals especially for field devices, the supporting plate having arranged thereon data lines of a local bus and voltage-supply lines, and said modules having at least local bus interfaces, and further comprising at least one bus coupling module which is attachable to the supporting plate and which is provided with a local bus interface and a field bus interface for communication with said modules and said automation system, characterized in that modules having a single plug-in place width and/or modules having at least a double plug-in place width are attachable to respective plug-in places of the supporting plate and identifiable by the bus coupling module and/or the automation system.

2. A signal-transmission device according to claim 1, characterized in that at least the modules having a double plug-in place width are multi-channel modules.

3. A signal-transmission device according to claim 1, characterized in that the modules having different plug-in place widths can be combined in an arbitrary manner.

4. A signal-transmission device according to claim 1, characterized in that the module comprises an encoder for the purpose of identification.

5. A signal-transmission device according to claim 1, characterized in that the encoder is adapted to be programmed by the bus coupling module and/or by the automation system.

6. A signal-transmission device according to claim 1, characterized in that the encoder can be programmed and/or adjusted prior to attaching the module.

7. A signal-transmission device according to claim 1, characterized in that the bus coupling module is provided with a configuration and/or parameter storage means.

8. A signal-transmission device according to claim 1, characterized in that at least one power unit module is attachable to the supporting plate.

9. A signal-transmission device according to claim 1, characterized in that the supporting plate is composed of supporting plate modules.

10. A signal-transmission device according to claim 1, characterized in that at least one supporting plate module is implemented as an interface module and/or as an auxiliary power supply module.

11. A signal-transmission device according to claim 1, characterized in that the module is provided with at least one display means.

12. A signal-transmission device according to claim 1, characterized in that the module is an I/O signal matching module.

13. A signal-transmission device according to claim 1, characterized in that at least the module having a single plug-in place width is implemented as an explosion-proof and/or intrinsically safe electrical equipment.

14. A signal-transmission device according to claim 1, characterized in that the module is provided with a screwed plug connection means on the front surface thereof.

15. A signal-transmission device according to claim 2, characterized in that the modules having different plug-in place widths can be combined in an arbitrary manner.

16. A signal-transmission device according to claim 2, characterized in that the module comprises an encoder for the purpose of identification.

17. A signal-transmission device according to claim 2, characterized in that the encoder is adapted to be programmed by the bus coupling module and/or by the automation system.

18. A signal-transmission device according to claim 2, characterized in that the encoder can be programmed and/or adjusted prior to attaching the module.

19. A signal-transmission device according to claim 2, characterized in that the bus coupling module is provided with a configuration and/or parameter storage means.

20. A signal-transmission device according claim 2, characterized in that at least one power unit module is attachable to the supporting plate.

* * * * *